(12) United States Patent
Taguchi et al.

(10) Patent No.: US 6,383,689 B1
(45) Date of Patent: May 7, 2002

(54) ATTENUATED PHASE-SHIFT MASK AND METHOD OF MANUFACTURING THE SAME

(75) Inventors: Takashi Taguchi; Noboru Uchida, both of Tokyo (JP)

(73) Assignee: Oki Electric Industry Co., Ltd., Tokyo (JP)

( * ) Notice: Subject to any disclaimer, the term of this patent is extended or adjusted under 35 U.S.C. 154(b) by 0 days.

(21) Appl. No.: 09/457,475

(22) Filed: Dec. 9, 1999

(30) Foreign Application Priority Data

Dec. 15, 1998 (JP) .......................................... 10-356513

(51) Int. Cl.⁷ ............................. G03F 9/00; G06F 17/50
(52) U.S. Cl. ............................................. 430/5; 716/21
(58) Field of Search ........................... 430/5, 296, 322, 430/394; 716/19–21

(56) References Cited

U.S. PATENT DOCUMENTS 5,827,623 A  * 10/1998  Ishida et al. ................... 430/5
5,923,562 A  *  7/1999  Liebmann et al. ........... 364/488

* cited by examiner

*Primary Examiner*—S. Rosasco
(74) *Attorney, Agent, or Firm*—Junichi Mimura

(57) ABSTRACT

In a halftone phase shift mask including a mask substrate and a rectangular pattern having a side (L) formed on the substrate, which is defined within a large pattern which is transferred on a resist material formed on a semiconductor substrate, the rectangular pattern includes a plurality of first opaque patterns, each having a width (ML) equal to 1 to 1½ times the resolution limit of the resist material at least one transparent opening pattern, having a width (MS) less than half the resolution limit, and wherein the number (X) of the opaque patterns and transparent opening patterns is determined by a formula of:

$$X = 2P + 1,$$

where $$P = \text{ROUND UP}\,((L-ML)/(ML+MS)).$$

20 Claims, 13 Drawing Sheets

ATTENUATED PHASE-SHIFT MASK AND METHOD OF MANUFACTURING THE SAME

CROSS-REFERENCE TO RELATED APPLICATION

This application claims the priority benefit of Japanese Patent Application No. 10-356513, filed Dec. 15, 1998, the entire subject matter of which is incorporated herein of reference.

BACKGROUND OF THE INVENTION

1. Field of the Invention

The invention relates to an attenuated phase-shift mask which is used in a lithographic process used in manufacturing a semiconductor device, and also to a method of manufacturing the device.

2. Description of the Related Art

With an increase in the level of integration of semiconductor integrated circuits, there have been rapid advances in minimizing micropatterns used for circuitry. To improve the resolution, various technologies have been applied. For example, a short wavelength or a projection lens having a high numerical aperture is used in lethographic processes. Specifically, a projection lens having high numerical apertures is effective to form a pattern having a width, which is less than the exposure wavelength. However, a high numerical aperture has resulted in an insufficient depth of focus (DOF). So, recently, a resolution enhancement technique has been proposed, in which a pattern is formed on a phase-shift mask using a phase. A variety of types of phase-shift mask has been proposed to date, including an attenuated phase-shift mask for use in production of semiconductor integrated circuits. Specifically, the attenuated phase-shift mask is proposed because of its simple construction.

The attenuated phase-shift mask includes a pattern which is formed of chromium (Cr) and a pattern called as a shifter which is formed of MoSi. A light waveform is modulated by the shifter so that the phase of the light is shifted by 180 degrees according to the following formula:

$$d=\lambda/2(n-1)$$

Where d is the thickness of the shifter, $\lambda$ is the wavelength, and n is the refractive index of the shifter.

In such an attenuated phase-shift mask, the MoSi pattern passes a few to ten-odd percent of the light whose phase is inverted from the light which passes through an area of the mask other than the pattern.

The technique is expected to improve the resoulution and the DOF by forming rectangular hole patterns whose length of the longer side is half as great as the resolution limit of the resist material, which is formed on the semiconductor substrate, in the patterns of the attenuated phase-shift mask. Futhermore, The technique is expected to improve the resolution and the DOF by forming a repeated line pattern in the patterns of the attenuated phase-shift mask when a modified illumination, such as an annular illumination, is used.

To fabricate the attenuated phase-shift mask, first, the phase shifter is formed as a layer of MoSi on a mask substrate, and then the Cr layer is formed on the MoSi layer. A first resist layer is formed on the Cr layer, and then parts of the Cr layer and the MoSi layer are removed to make a first hole in the MoSi layer by the lithographic process. After that, a second resist film is formed on the entire surface of the mask, a part of the Cr layer which surrounds the hole is removed to make a second hole in the Cr layer by an etching process. The rectangular holes having the first and second opening, whose length of the longer side is half as great as the resolution limit of the resist material formed on the semiconductor substrate, are completed.

However, if a large number of patterns of holes are formed in a large Cr pattern, the amount of CAD data requesting to form the attenuated phase-shift mask also becomes large. Further, the process for manufacturing such an attenuated phase-shift mask is complicated because, as described above, patterns should be formed twice. Also, in addition to the CAD data for patterning the Cr layer, other CAD data is required for forming the holes in the Cr pattern.

On the other hand, when the attenuated phase-shift mask having a repeated line pattern is used with an annular illumination, no problem is found when a resist pattern on the semiconductor device has a width, which is close to the resolution limit of a resist material formed on the Si substrate. However, when some patterns having a width twice as great as the resolution limit are transferred to the resist layer from the Cr mask, a bad resist profile is liable to be formed at the edge of the resist pattern. Furthermore, the thickness of the resist pattern sometimes becomes thinner at the pattern edge.

Therefore, both methods described above are not satisfied when the large resist pattern is formed.

SUMMARY OF THE INVENTION

An objective of the invention is to provide an attenuated phase-shift mask including a mask pattern which has a light shield characteristic.

Another objective of the invention is to provide an attenuated phase-shift mask including a mask pattern which causes a fine resist pattern profile to form and causes the resist pattern to have uniform thickness.

Yet another objective of the invention is to provide an attenuated phase-shift mask having a mask pattern that is formed by a small amount of CAD.

To achieve these objectives, in an attenuated phase-shift mask including a mask substrate and a rectangular pattern having a side (L) formed on the substrate, which is defined within a large pattern which is transferred on a resist material formed on a semiconductor substrate, the rectangular pattern includes a plurality of first opaque patterns, each having a width (ML) equal to 1 to 1½ times the resolution limit of the resist material at least one transparent opening pattern, having a width (MS) less than half the resolution limit, and wherein the number (X) of the opaque patterns and transparent opening patterns is determined by the following equations:

$$X=2P+1,$$

where $$P=\text{ROUND UP}\ ((L-ML)/(ML+MS)),$$

where the term "ROUND UP" defines that P takes a value of the next highest integer value if (L−ML) divided by (ML+MS) is not an integer.

Furthermore, to achieve these objectives, in an attenuated phase-shift mask including a mask substrate and a rectangular pattern having a side (L) formed on the substrate, which is defined within a large pattern which is transferred on a resist material formed on a semiconductor substrate, the rectangular pattern includes a frame shaped opaque pattern having a width (ML1) equal to 1 to 1½ times the resolution limit of the resist material, a rectangular area spaced from the frame shaped opaque pattern having a width (MS2) less than half the resolution limit, the area having a plurality of first opaque patterns, each having a width (ML2) equal to 1 to 1½ times the resolution limit and a transparent opening pattern having a width (MS2) less than half the resolution limit, and wherein the number (X) of the opaque patterns and transparent opening patterns is determined by the following equations:

$$X=2P+1,$$

where $$P=\text{ROUND UP } ((L-2(ML1+MS1)-ML1)/(ML1+MS2)),$$

where the term "ROUND UP" defines that P takes a value of the next highest integer value if (L−2(ML1+MS)−ML1) divided by (ML1+MS2) is not an integer.

Further, to achieve these objectives, in an attenuated phase-shift mask including a mask substrate and a rectangular pattern formed on the substrate, which is defined within a large pattern which is transferred on a resist material formed on a semiconductor substrate, the rectangular pattern includes a frame shaped opaque pattern having a width equal to 1 to 1½ times the resolution limit of the resist material, a frame shaped transparent opening pattern having a width less than half the resolution limit, the frame shaped transparent opening pattern being surrounded by the frame shaped opaque pattern, and an rectangular opaque pattern which is surrounded by the frame shaped transparent opening pattern.

Also, to achieve these objectives, in an attenuated phase-shift mask including a mask substrate and a rectangular pattern formed on the substrate, which is defined within a large pattern which is transferred on a resist material formed on a semiconductor substrate, the rectangular pattern includes four rectangular transparent opening patterns, each having a width less than the resolution limit of the resist material, which is elongated along one of each side of the rectangular pattern, and is spaced from each side of the rectangular pattern by a distance, which is more than the resolution limit of the resist material.

BRIEF DESCRIPTION OF THE DRAWINGS

The invention will be more particularly described with reference to the accompanying drawings in which.

DETAILED DESCRIPTION OF THE PREFERRED EMBODIMENTS

Figure 1A:
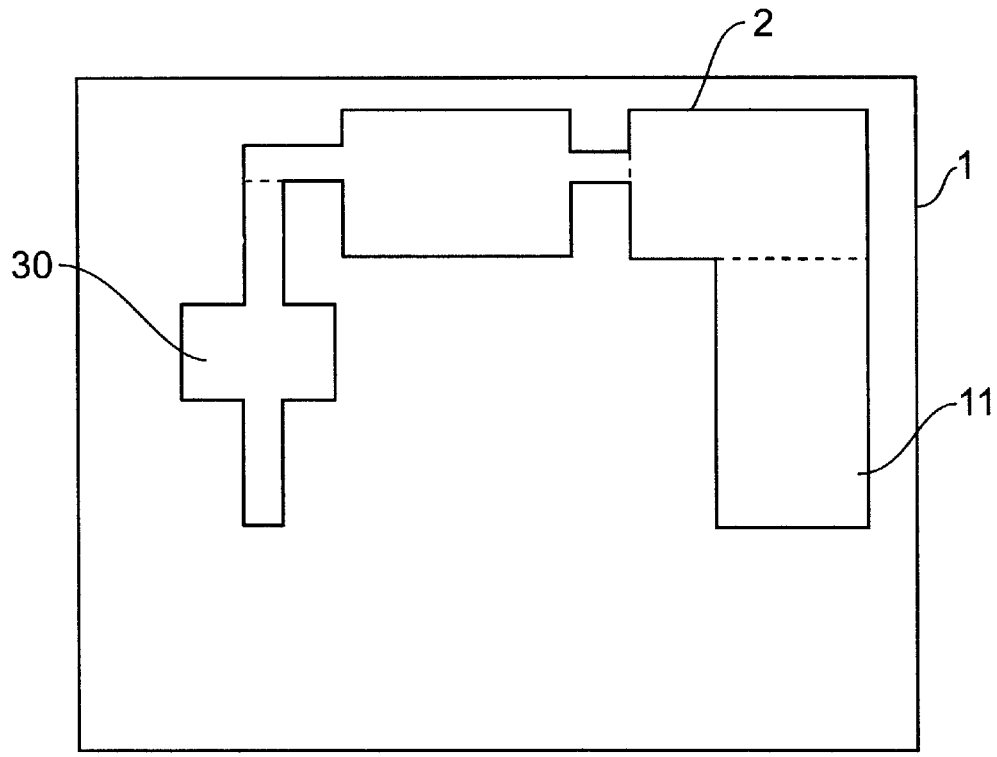
FIG. 1A is an illustration of an attenuated phase-shift mask including a large pattern having a complex shape.
Figure 1B:
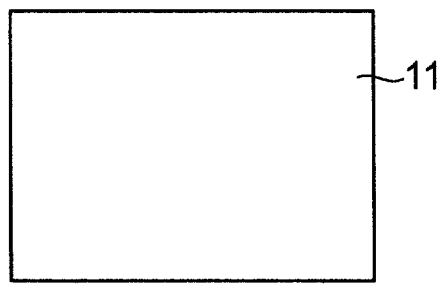
FIG. 1B is an illustration of a rectangular pattern which is defined within the large pattern, according to the first embodiment of the invention.
Figure 1C:
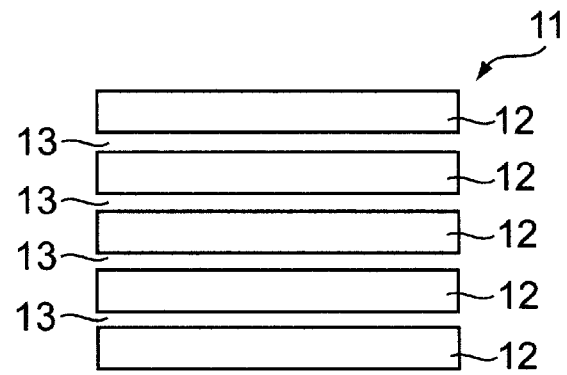
FIG. 1C is a plan view showing details of the attenuated phase-shift mask shown in FIG. 1B.

Referring to FIG. 1A, a large pattern 2 having a complex shape is formed on an attenuated phase-shift mask 1. The large pattern 2 is transferred to a resist film formed on a silicon substrate. The large pattern 2 has characteristics of a light shield. Referring to FIGS. 1B and 1C, a rectangular pattern 11 having sides of length 5–10 $\mu$m is defined within a large pattern 2. The pattern 11, which also has characteristics of a light shield, includes rectangular opaque patterns 12 which each have a width equal to 1 to 1½ times the resolution limit of the resist film on which the large pattern is transferred, and rectangular transparent opening patterns 13 which each have a width less than half the resolution limit. The rectangular transparent opening patterns 13 is disposed between the rectangular opaque patterns 12. For example, if the lithographic process is performed under the following conditions, the shorter sides of the opaque pattern 12 and the transparent opening pattern 13 on the attenuated phase-shift mask is designed so as to transfer the mask patterns to the resist layer on the semiconductor substrate whose lengths of the shorter sides are 0.20 μm and 0.05 μm respectively.

(a) the lithographic process are performed by a KrF excimer laser.
(b) the numerical aperture is 0.6.
(c) the transparency of the attenuated phase-shift mask is six percent.
(d) the annular illumination is covered at the center by a circular shield having a diameter half as long as a diameter of the annular illumination.

To reduce the number of drawings requested to form an attenuated phase-shift mask, it is preferable to divide the patterns 11 into the rectangular opaque patterns 12 and the transparent opening pattern 13 as large as possible while still a sufficient light shield, considering the optical condition for the lithography process including the numerical aperture and the shape of the illumination, and the characteristics of the resist material on which the pattern is transferred. Further, to further reduce the numbers of drawings requested to form an attenuated phase-shift mask and associated CAD data, it is preferable to form the rectangular opaque patterns 12 having a longer side which is along by the longer side of the pattern 11.

Figure 2A:
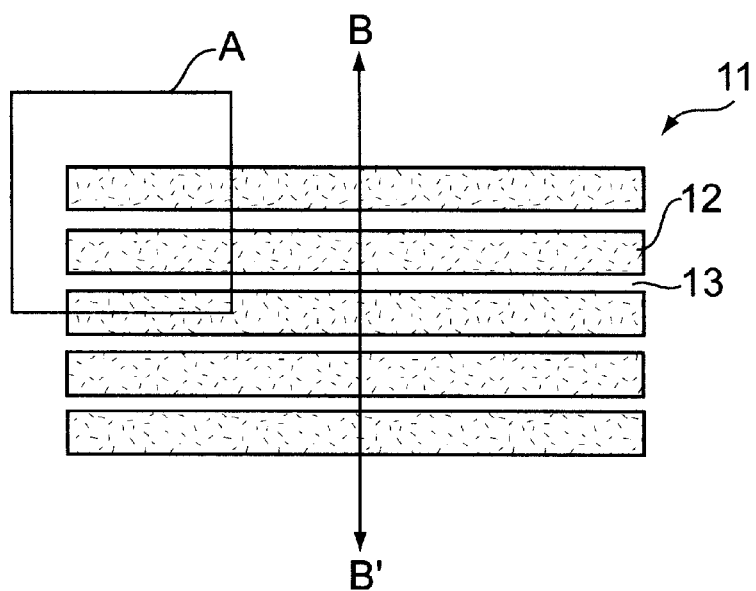
FIG. 2A is an illustration of the attenuated phase-shift mask shown in FIG. 1C, which is exposed to light.
Figure 2B:
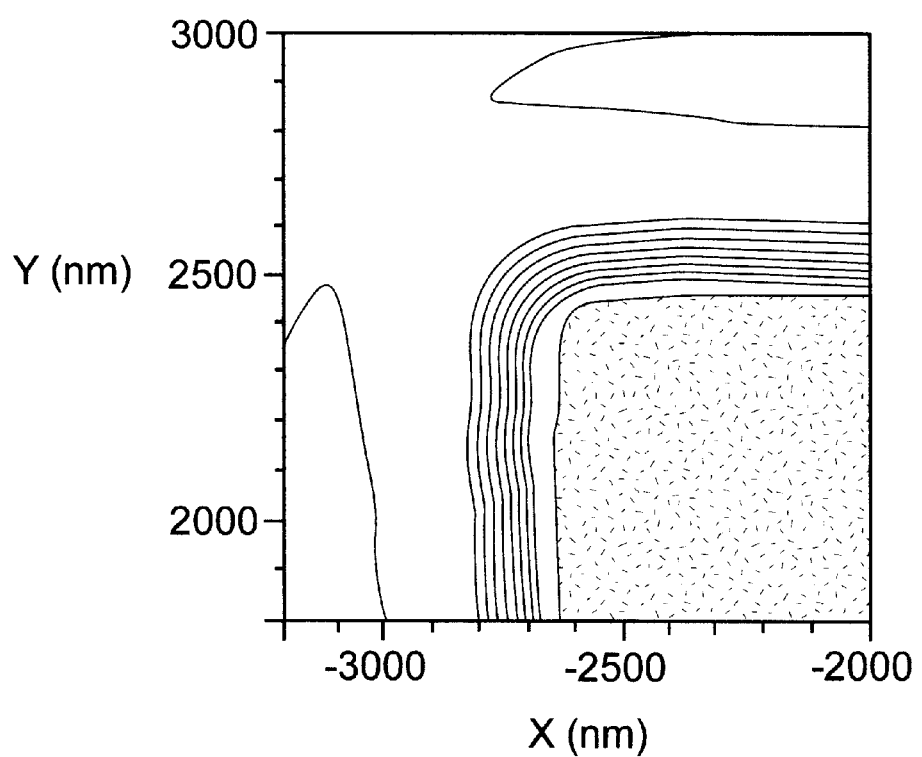
FIG. 2B is a graph showing characteristics of the light intensity in an area A of the attenuated phase-shift mask shown in FIG. 2A.
Figure 2C:
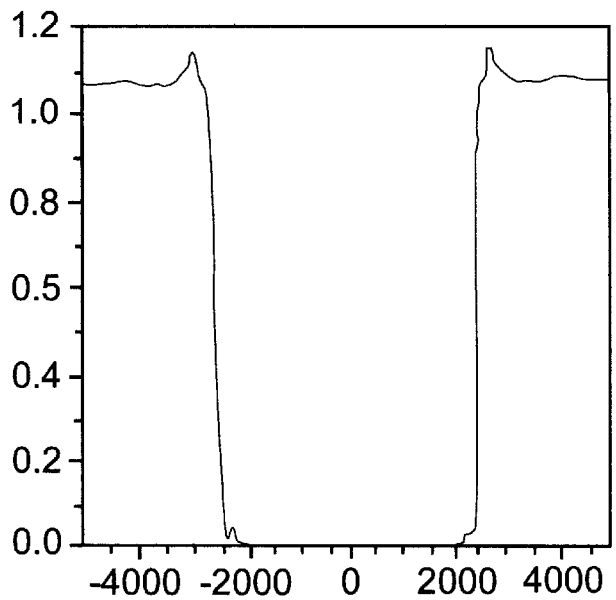
FIG. 2C is a graph showing characteristics of the light intensity on a semiconductor wafer in the range of B–B' shown in FIG. 2A.

In FIG. 2B, the two dimensioned light intensity in an area A of FIG. 2A is shown, where the horizontal axis corresponds the X axis in FIG. 2A which is measured in nanometers (nm), and the vertical axis corresponds the Y axis is FIG. 2A which is measured in nanometers (nm). In FIG. 2C, the light intensity on the semiconductor wafer corresponding to the range of B–B' of FIG. 2A is shown, where the horizontal axis shows locations (nm) on the semiconductor wafer, and the vertical axis shows the light intensity.

According to this first embodiment, as illustrated in FIGS. 2B and 2C, the fine light shield characteristics are obtained at four corners and edges of the pattern 11.

Further, although the resist pattern having the poor resist profile at its side edges and its corners is formed because of a side peak phenomenon when a conventional attenuated phase-shift mask to form a resist pattern is used, this problem can be avoided according to the first embodiment. Furthermore, it is possible to reduce the CAD data associated with the patterns on the attenuated phase-shift mask.

Figure 3:
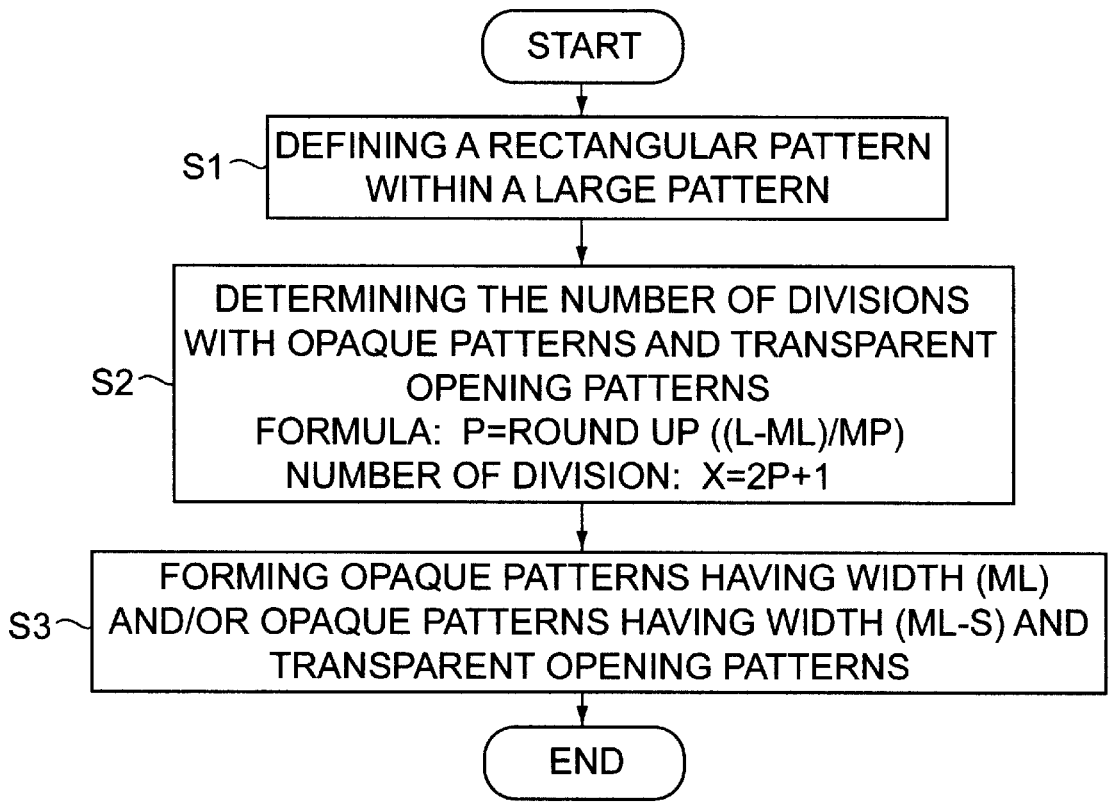
FIG. 3 is a flow chart to design the attenuated phase-shift mask, according to the first embodiment of the invention.

These patterns can be formed by performing the following steps which are illustrated in FIG. 3.

First, a rectangular pattern 11 is defined within a large pattern 2 on an attenuated phase-shift mask (Step S1). Next, the pattern 11 is divided into the rectangular opaque patterns 12 each having a width which equals the range between the resolution limit of the resist material and about one and half times as long as the resolution limit of the resist material and the rectangular transparent opening patterns 13 each having a width which is less than half as long as the resolution limit of the resist material. The number (X) of divisions is calculated by the following formula (Step S2):

$$X = 2P + 1$$

$$P = \text{ROUND UP}((L-ML)/MP)$$

Where L is the long or short side length of the pattern 11, ML is the max width of the opaque pattern, MS is the width of the transparent opening pattern, and MP is the pitch (ML+MS). In the formula, P takes a value of the next highest integer value if (L−ML) divided by MP is not an integer.

For example, if L is 14 μm, ML is 2 μm, and MS is 1 μm in FIGS. 1B and 1C, then P becomes 4. Therefore, the number X of the divisions is 9. This means that there will be five opaque patterns 12 and four transparent opening patterns 13.

After the calculation, the pattern 11 is divided. If the result of (L−ML)/MP is an integer, the pattern 11 is divided into a combination of the maximum opaque pattern having widths ML and the transparent opening patterns having widths MS. If the result of (L−ML)/MP is not an integer, the pattern 11 is divided into a combination of some maximum opaque patterns having widths ML and/or some opaque patterns having widths (ML−S) and the transparent opening patterns having widths MS. Here, S designates a minimum unit length which is known as the "minimum address unit" of a pattern exposure system, such as an electron beam lithography device. The number of the opaque patterns having widths (ML−S) is determined by the length of the shorter side of the pattern 11.

According to the first embodiment described above of the invention, as the pattern 11 is divided into a combination of the transparent opening pattern having width MS and the maximum opaque pattern having width ML and/or the opaque pattern having width (ML−S), the attenuated phase-shift mask pattern having a light shield effect can is formed on the attenuated phase-shift mask. Further, the CAD data for the patterns can be reduced.

Figure 4A:
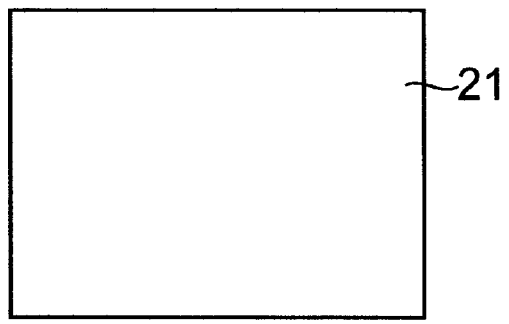
FIG. 4A is an illustration of a rectangular pattern which is defined within the large pattern, according to the second embodiment of the invention.
Figure 4B:
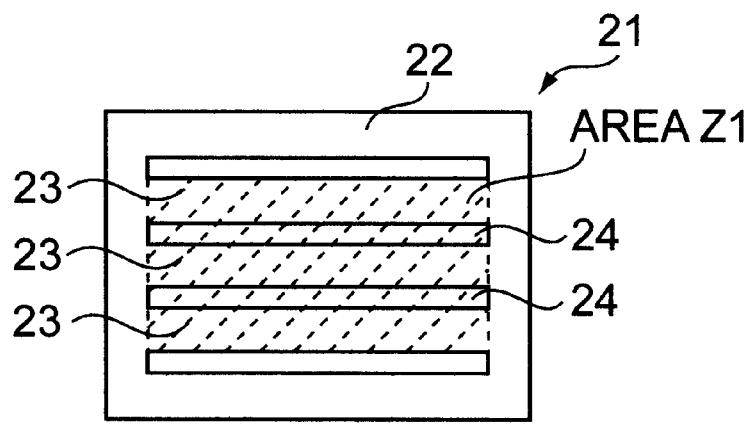
FIG. 4B is a plan view showing details of the attenuated phase-shift mask shown in FIG. 4A.

Referring to FIGS. 4A and 4B, a rectangular pattern 21 having sides of length 5–10 μm is defined within a large pattern 2. The pattern 21, which also has characteristics of a light shield, includes a frame pattern 22 which has a width equal to 1 to 1½ times the resolution limit of the resist film on which the large pattern is transferred, rectangular opaque patterns 23 which each have a width equal to 1 to 1½ times the resolution limit, and rectangular transparent opening patterns 24 which each have a width less than half the resolution limit. The rectangular transparent opening patterns 13 is disposed between the rectangular opaque patterns 12. The opaque pattern 23 and the transparent opening pattern 24 are formed in an area Z1 which is spaced from the frame pattern 22 with a length less than half the resolution limit in the short side direction. For example, if the lithographic process is performed under the following conditions, the shorter sides of the opaque pattern 23 and the transparent opening pattern 24 on the attenuated phase-shift mask is designed so as to transfer the mask patterns to the resist layer on the semiconductor substrate whose lengths of the shorter sides are 0.20 μm and 0.05 μm respectively.

(a) the lithographic process are performed a KrF excimer laser.
(b) the numerical aperture is 0.6.
(c) the transparency of the attenuated phase-shift mask is six percents.
(d) the annular illumination is covered at the center by a circular shield having a diameter half as long as a diameter of the annular illumination.

To reduce the number of drawing requested to form an attenuated phase-shift mask, it is preferable to divide the patterns 21 into the rectangular opaque patterns 23 and the transparent opening pattern 24 as large as possible while still sufficient light shield, considering the optical condition for the lithography process including the numerical aperture and the shape of the illumination, and the characteristics of the resist material on which the pattern is transferred. Further, to further reduce the numbers of drawing requested to form an attenuated phase-shift mask and associated CAD data, it is preferable to form the rectangular opaque patterns 23 having a longer side which is along by the longer side of the pattern 21.

Figure 5A:
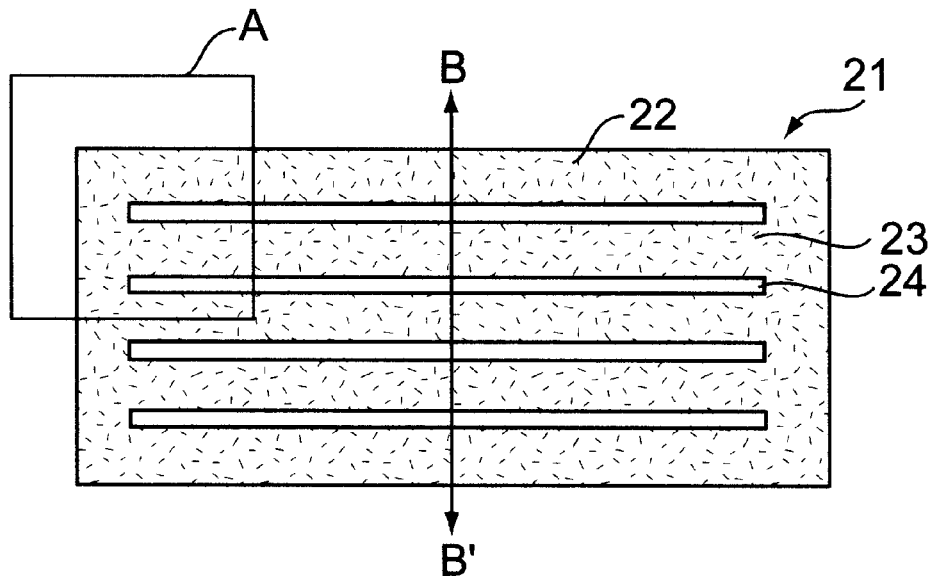
FIG. 5A is an illustration of the attenuated phase-shift mask shown in FIG. 4B which is exposed to light.
Figure 5B:
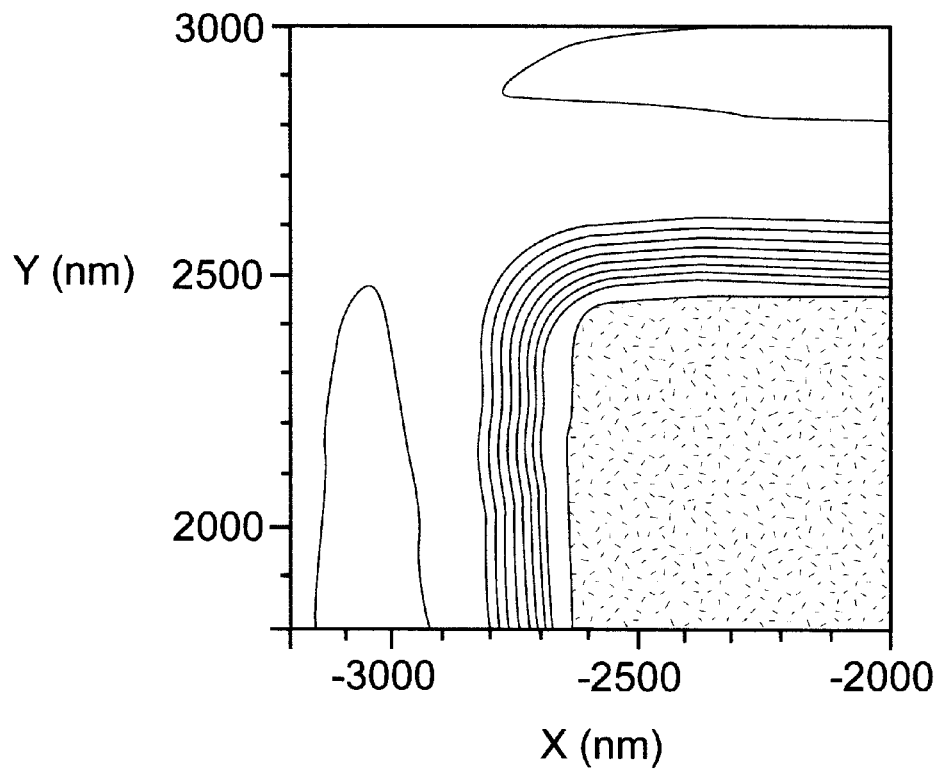
FIG. 5B is a graph showing characteristics of the light intensity in an area A of the attenuated phase-shift mask shown in FIG. 5A.
Figure 5C:
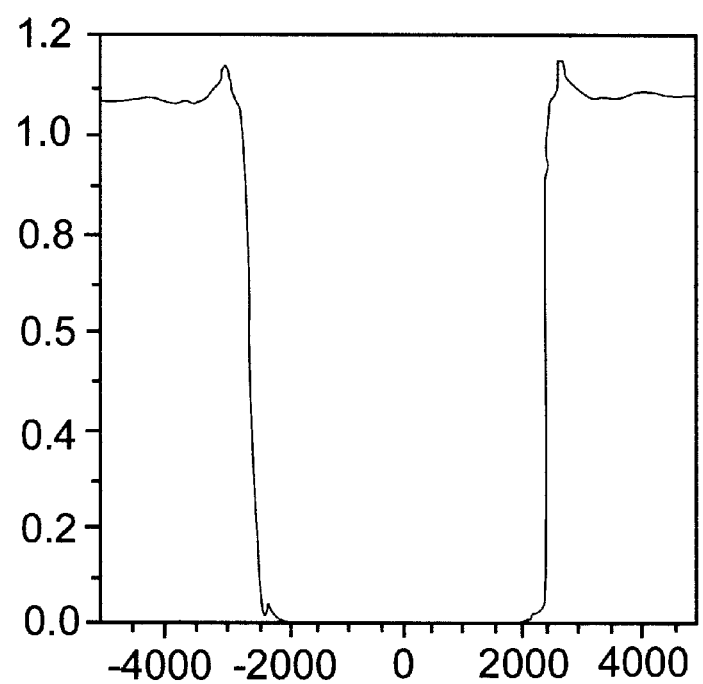
FIG. 5C is a graph showing characteristics of the light intensity on a semiconductor wafer in the range of B–B' shown in FIG. 5A.

Referring to FIG. 5B, the two dimensioned light intensity in an area A of FIG. 5A is shown, where the horizontal axis corresponds the X axis in FIG. 5A which is measured in nanometers (nm), and the vertical axis corresponds the Y axis is FIG. 5A which is measured in nanometers (nm). In FIG. 5C, the light intensity on the semiconductor wafer corresponding to the range of B–B' of FIG. 5A is shown, where the horizontal axis shows locations (nm) on the semiconductor wafer, and the vertical axis shows the light intensity.

According to this second embodiment, as illustrated in FIGS. 5B and 5C, the fine light shield characteristics are obtained at four corner and edges of the patters 21.

Further, although the resist pattern having the poor resist profile at its side edges and its corners is formed because of a side peak phenomenon when a conventional attenuated phase-shift mask to form a resist pattern is used, this problem can be avoided according to the first embodiment. Furthermore, it is possible to reduce the CAD data associated with the patterns on the attenuated phase-shift mask.

Figure 6:
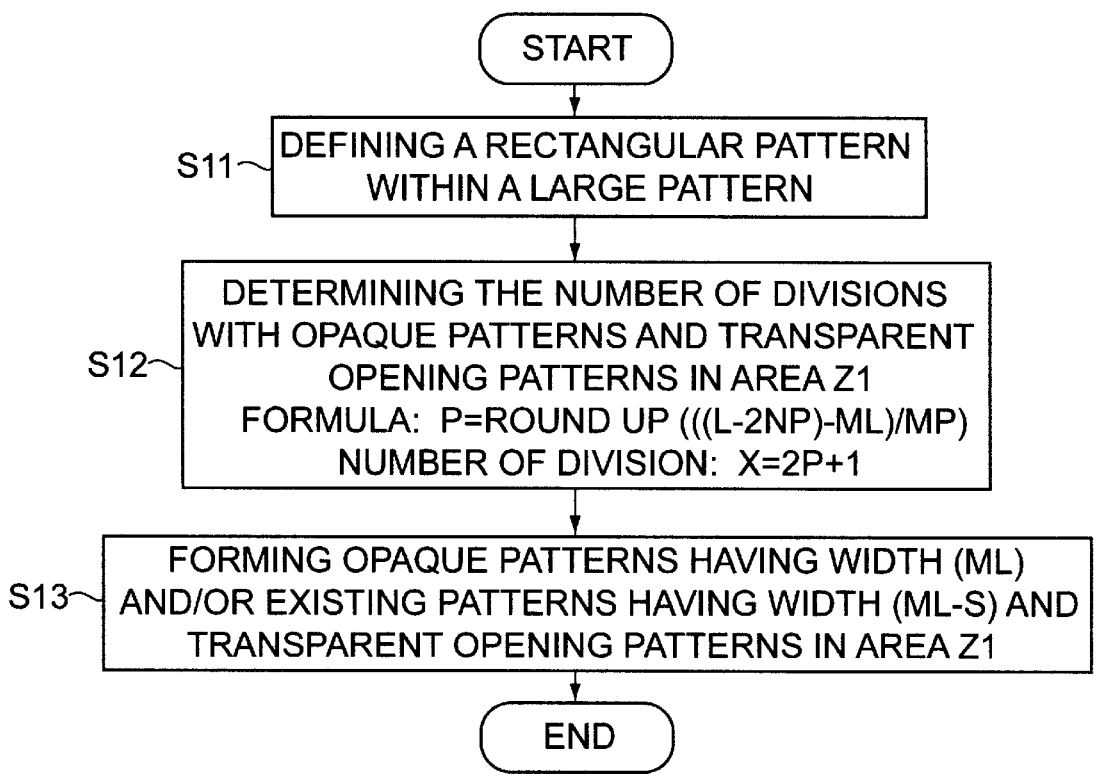
FIG. 6 is a flow chart to design the attenuated phase-shift mask, according to the second embodiment of the invention.

These patterns can be formed by performing the following steps which are illustrated in FIG. 6.

First, a rectangular pattern 21 is defined within a large pattern 2 on an attenuated phase-shift mask (Step S11).

Next, the area Z1 which is spaced from the frame pattern 22 in the short side direction is divided into the rectangular opaque patterns 23 and the rectangular transparent opening patterns 24. These patterns 23, 24 has the same characteristics as the pattern 12, 13 described in the first embodiment. The number (X) of divisions is calculated by the following formula (Step S12):

$X=2P+1$ $P=\text{ROUND UP } (((L-2NP)-ML)/MP)$,

Where L is the long or short side length of the pattern 21, NP is the sum of the width of the frame pattern and the width of the space, ML is the width of the maximum opaque pattern, MS is the width of the maximum transparent opening pattern, and MP is the pitch (ML+MS). In the formula, P takes a value of the next highest integer value if ((L−2NP)−ML) divided by MP is not an integer.

For example, if L is 14 $\mu$m, NP is 3 $\mu$m, ML is 2 $\mu$m, and MS is 1 $\mu$m in FIGS. 4(a) and (b), then P becomes 2. Therefore, the number X of the division is 5. This means that there are three opaque patterns 23 and two transparent opening patterns 24 in the area Z1.

After the calculation, the area Z1 is divided is divided. If the result of ((L−2NP)−ML)/MP is an integer, the area Z1 is divided into a combination of the maximum opaque pattern having widths ML and the transparent opening patterns having widths MS. If the result of ((L−2NP)−ML)/MP is not an integer, the area Z1 is divided into a combination of some maximum opaque patterns having widths ML and/or some opaque patterns having widths (ML−S) and the transparent opening patterns having widths MS. Here, S designates a minimum unit length which is known as the "minimum address unit" of a pattern exposure system, such as an electron beam lithography device. The number of the opaque patterns having widths (ML−S) is determined by the length of the shorter side of the area Z1.

According to the second embodiment described above of the invention, as the pattern 21 is divided into the frame pattern and the area Z1, and the area Z1 is divided into a combination of the transparent opening patterns having widths MS and the maximum opaque patterns having widths ML and/or an opaque patterns having widths (ML−S), the attenuated phase-shift mask pattern having a light shield effect can be formed on the attenuated phase-shift mask. Further, as the number of divisions can be reduced, the CAD data for the patterns also can be reduced.

Figure 7A:
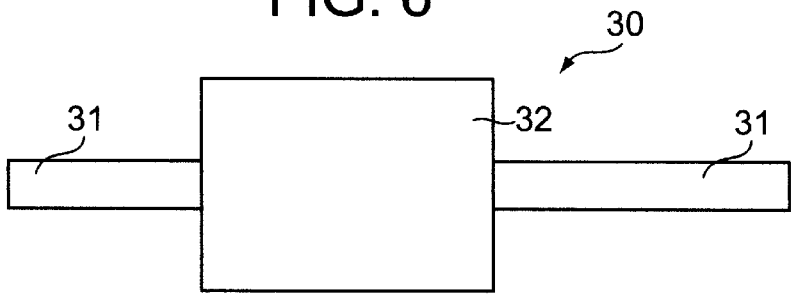
FIG. 7A is an illustration of a pattern which is defined within the large pattern, according to the third embodiment of the invention.

A circuit pattern consists of several patterns having various widths and various lengths as shown in FIG. 1A. Therefore, when a combination of rectangular patterns is defined within a circuit pattern, a mask pattern 30 shown in FIG. 7A is defined. The pattern 30 is comprised with the first rectangular patterns 31 having a shorter side which is less than twice the resolution limit and the second rectangular pattern 32 having sides which is more than twice the resolution limit respectively as shown in FIG. 7A.

The first rectangular pattern 31 is a part that the attenuated phase-shift mask effect should be obtained, and the second rectangular pattern 32 is a part that the attenuated phase-shift mask effect should not be obtained and should have characteristics of a light shield. The bad profile is easily occurred at the edges and corners of the second rectangular pattern 32 in the lithography when the modified illumination is used.

Figure 7B:
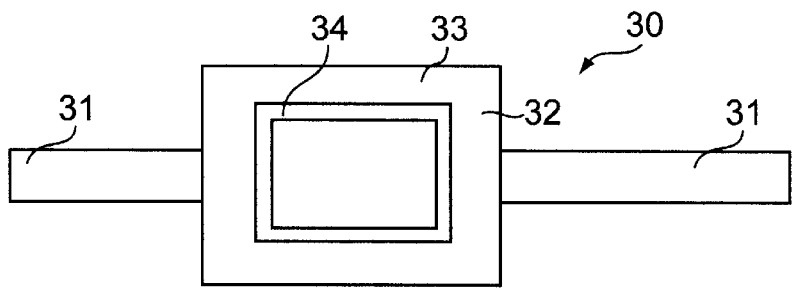
FIG. 7B is a plan view showing details of the attenuated phase-shift mask shown in FIG. 7A.

Referring to FIG. 7B, the second rectangular pattern 32 has a frame-shaped transparent opening pattern 34 which has a width less than half the resolution limit, a frame shaped opaque pattern 33 which has a width at least equal to 1 to 1½ times the resolution limit and an area which is surrounded by the frame-shaped transparent opening pattern 34. It is acceptable to form some rectangular transparent opening patterns described in the first embodiment in the area if the area is large enough. So, a further fine light-shield characteristic can be obtained.

Figure 8A:
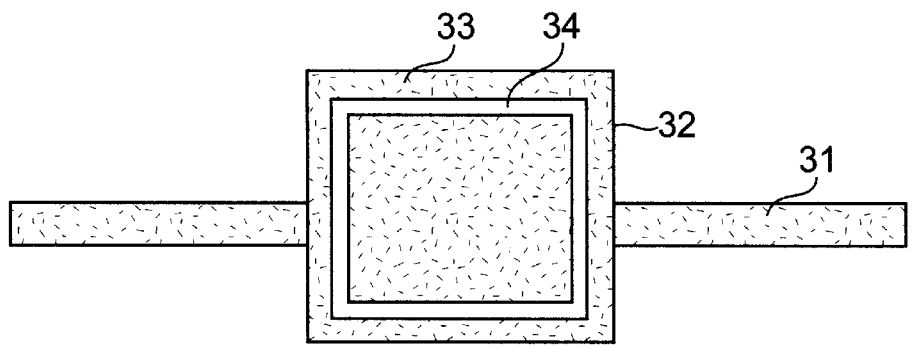
FIG. 8A is an illustration of the attenuated phase-shift mask shown in FIG. 7B which is exposed to light.
Figure 8B:
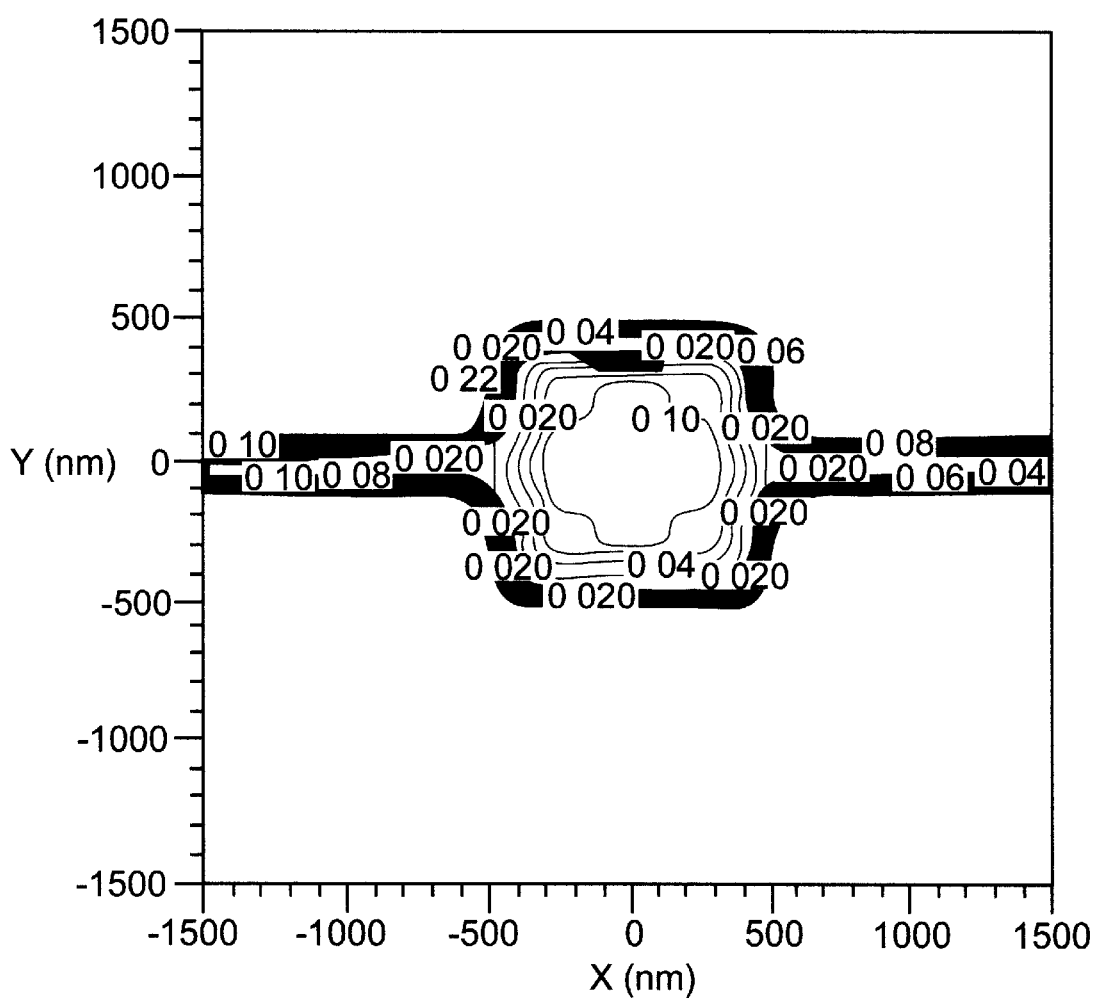
FIG. 8B is a graph showing characteristics of the light intensity of the conventional attenuated phase-shift mask without a frame shaped transparent opening pattern.
Figure 8C:
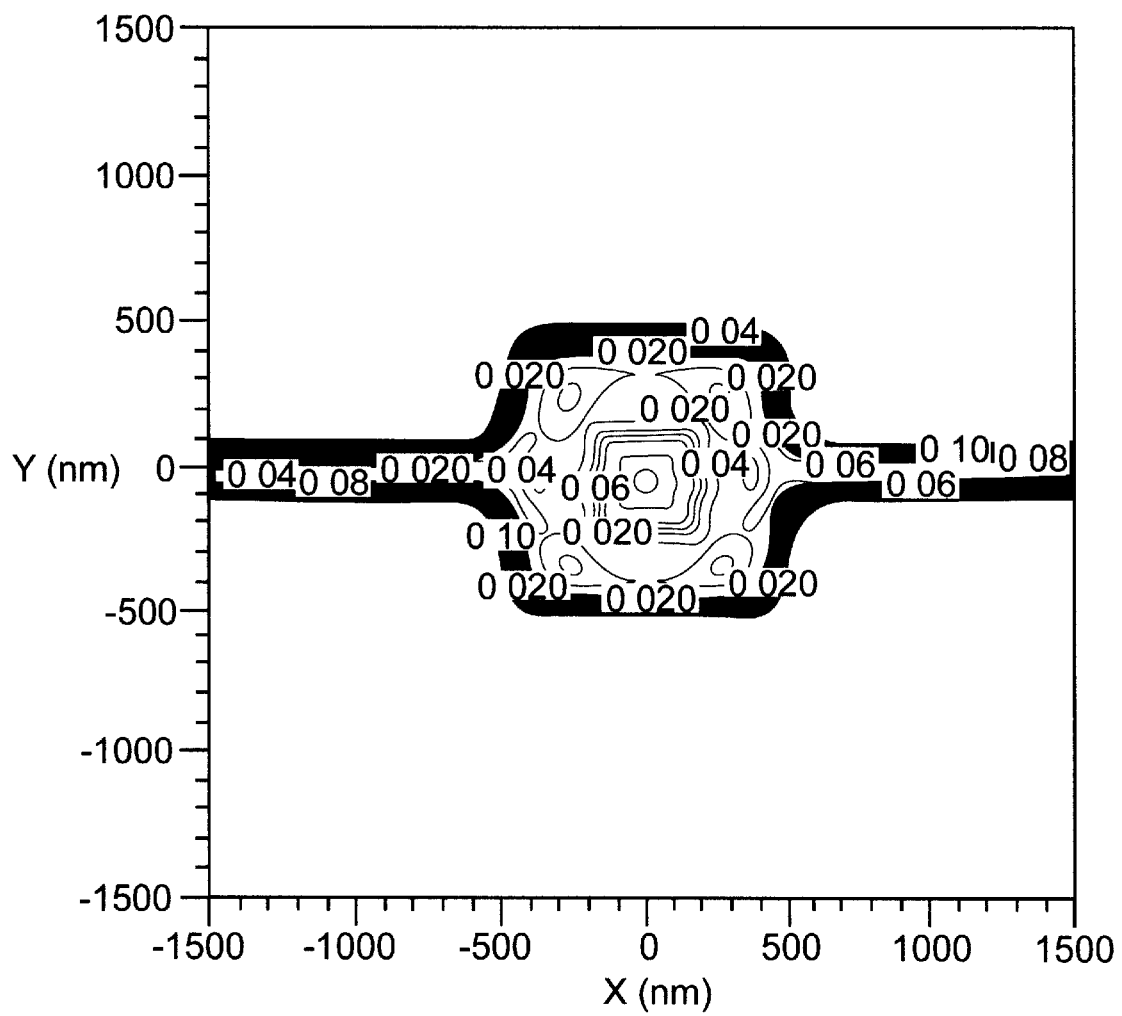
FIG. 8C is a graph showing characteristics of the light intensity of the attenuated phase-shift mask with a frame shaped transparent opening pattern shown in FIG. 8A.

Comparing to FIG. 8B to FIG. 8C, it is found that the maximum intensity of light of the second rectangular pattern 32 of FIG. 7B can be repressed. Therefore, according to the third embodiment described above of the invention, the fine light shield characteristics are obtained. Further, although the resist pattern having the poor resist profile at its side edges and its corners is formed because of a side peak phenomenon when a conventional attenuated phase-shift mask to form a resist pattern is used, this problem can be avoided according to the third embodiment.

Figure 9:
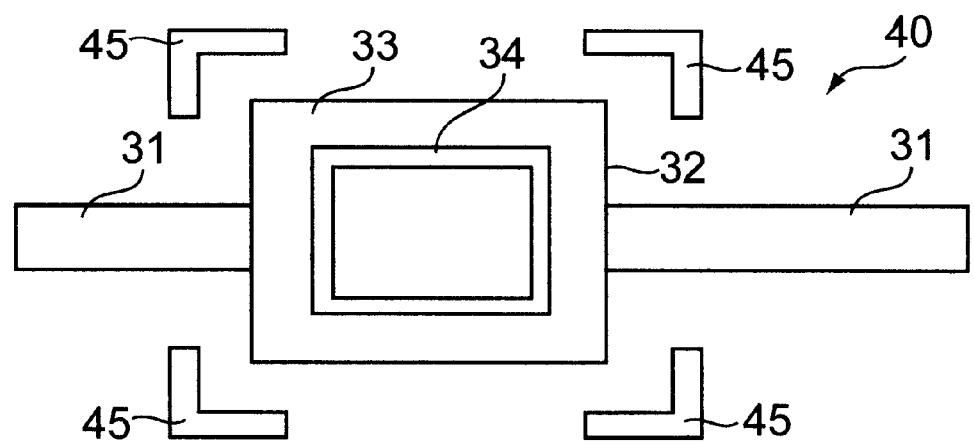
FIG. 9 is a plan view showing details of the first alternative attenuated phase-shift mask as the fourth embodiment.

Further, a first alternative mask pattern 40 as the fourth embodiment shown in FIG. 9 can be formed if the mask pattern which is defined within a circuit pattern has a shape shown in FIG. 7A. Referring to FIG. 9, the first alternative mask pattern 40 has a frame-shaped transparent opening pattern 34 which is formed by the method descried above, a frame shaped opaque pattern 33 which is formed by the method descried above, an area which is surrounded by the frame-shaped transparent opening pattern 34, a first rectangular opaque pattern 31, and L-letter opaque patterns 45 at the corners of the second rectangular pattern 32, which is spaced with a length which is less than the resolution limit. Each L letter pattern has a width less than half the resolution limit. Further, it is also acceptable to form some rectangular transparent opening patterns described in the first embodiment in an area surrounded by the frame-shaped transparent opening patterns 34 if the area of the second rectangular pattern 32 is large enough.

Figure 10A:
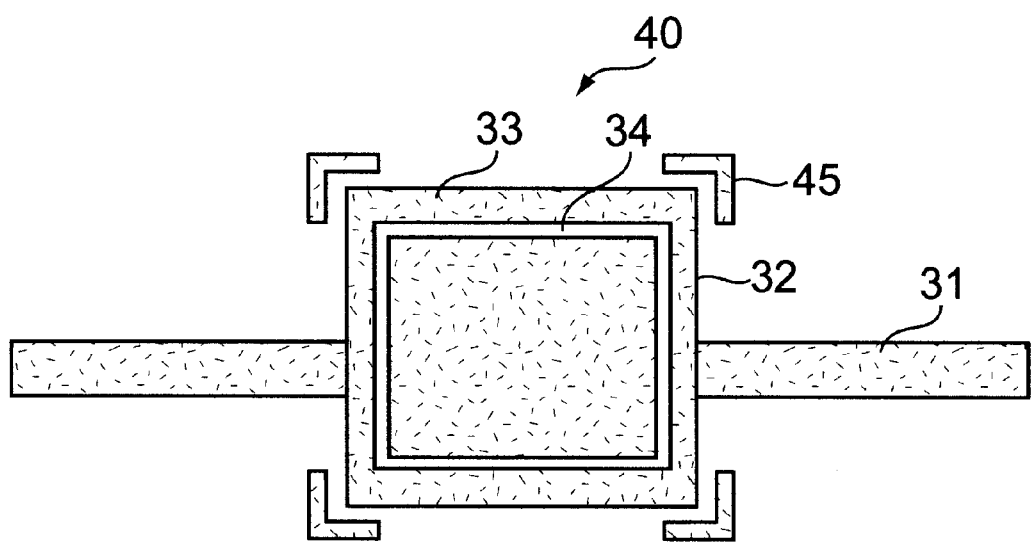
FIG. 10A is an illustration of the first alternative attenuated phase-shift mask shown in FIG. 9 which is exposed to light.
Figure 10B:
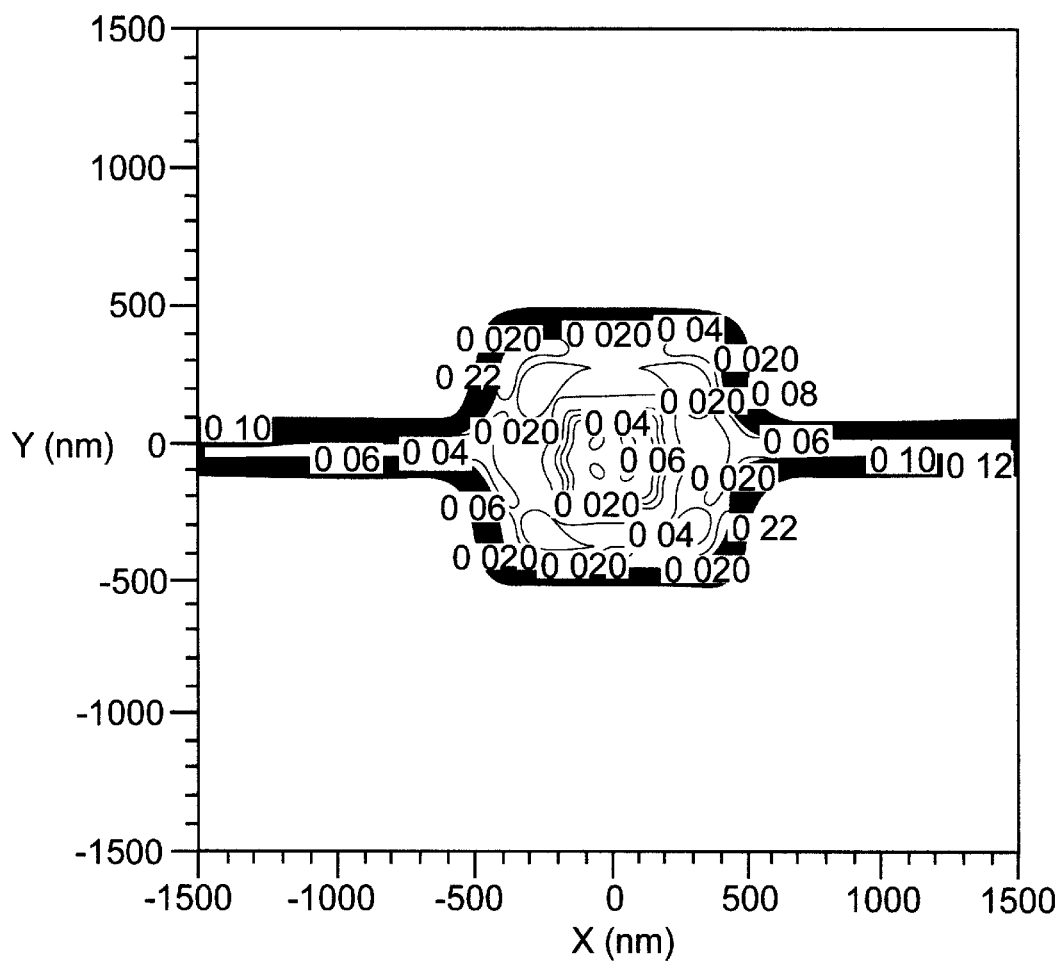
FIG. 10B is a graph showing characteristics of the light intensity of the first alternative attenuated phase-shift mask shown in FIG. 10A.

As shown in FIG. 10B, according to the fourth embodiment described above of the invention, the maximum light intensity can be repressed at the second rectangular pattern 32, and it is possible to avoid a bad resist profile which is liable to formed at the edges of the resist pattern, and also avoid to form thinner resist pattern at the pattern edge which is formed by the side peak effect.

Figure 11:
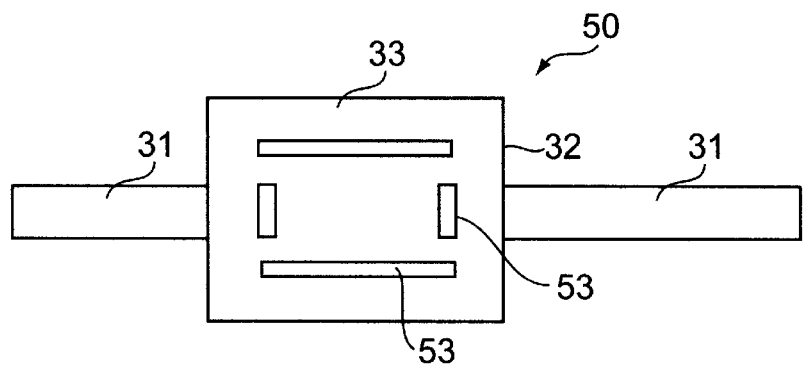
FIG. 11 is a plan view showing details of the second alternative attenuated phase-shift mask as the fifth embodiment.

Furthermore, a second alternative mask pattern 50 as the fifth embodiment shown in FIG. 9 can be formed if the mask pattern which is defined within a circuit pattern has a shape shown in FIG. 7A. Referring to FIG. 11, the second alternative mask pattern 50 has the first rectangular pattern 31 and the second rectangular pattern 32. Four rectangular transparent opening patterns 53 along by each side of the second rectangular pattern 32 are formed in the second rectangular pattern 32. Each rectangular transparent opening pattern 53 are spaced with a length from the side of the second rectangular pattern, which is more than the resolution limit, and each rectangular transparent opening pattern 53 has a width which is less than half the resolution limit. The minimum length between the rectangular transparent opening patterns 53 is equal to the resolution limit. Further, it is also acceptable to form some rectangular transparent opening patterns described in the first embodiment in an area surrounded by the rectangular transparent opening patterns 53 if the area is large enough.

Figure 12A:
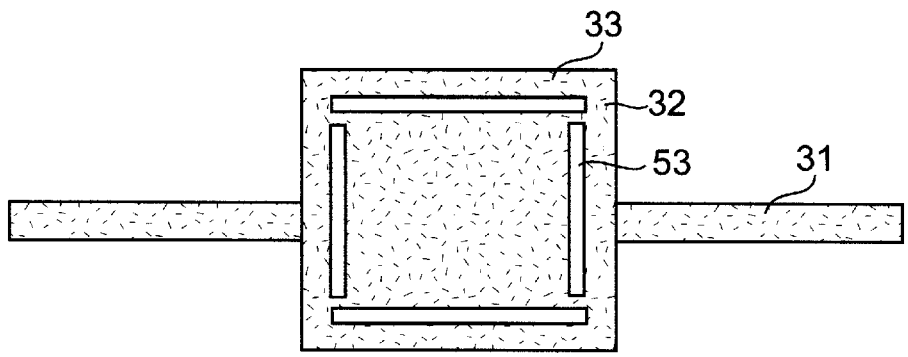
FIG. 12A is an illustration of the attenuated phase-shift mask shown in FIG. 11 which is exposed to light.
Figure 12B:
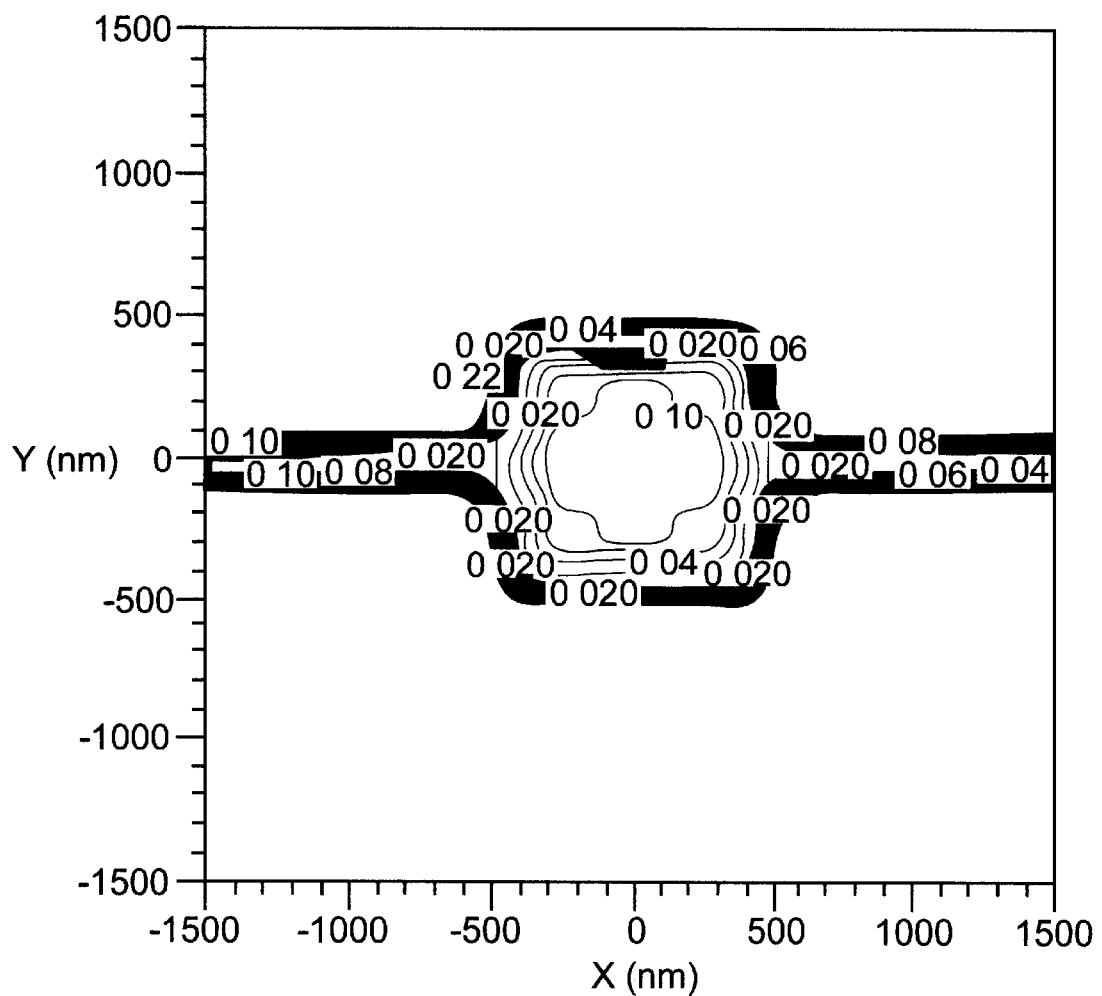
FIG. 12B is a graph showing characteristics of the light intensity of the conventional attenuated phase-shift mask without any transparent opening patterns.
Figure 12C:
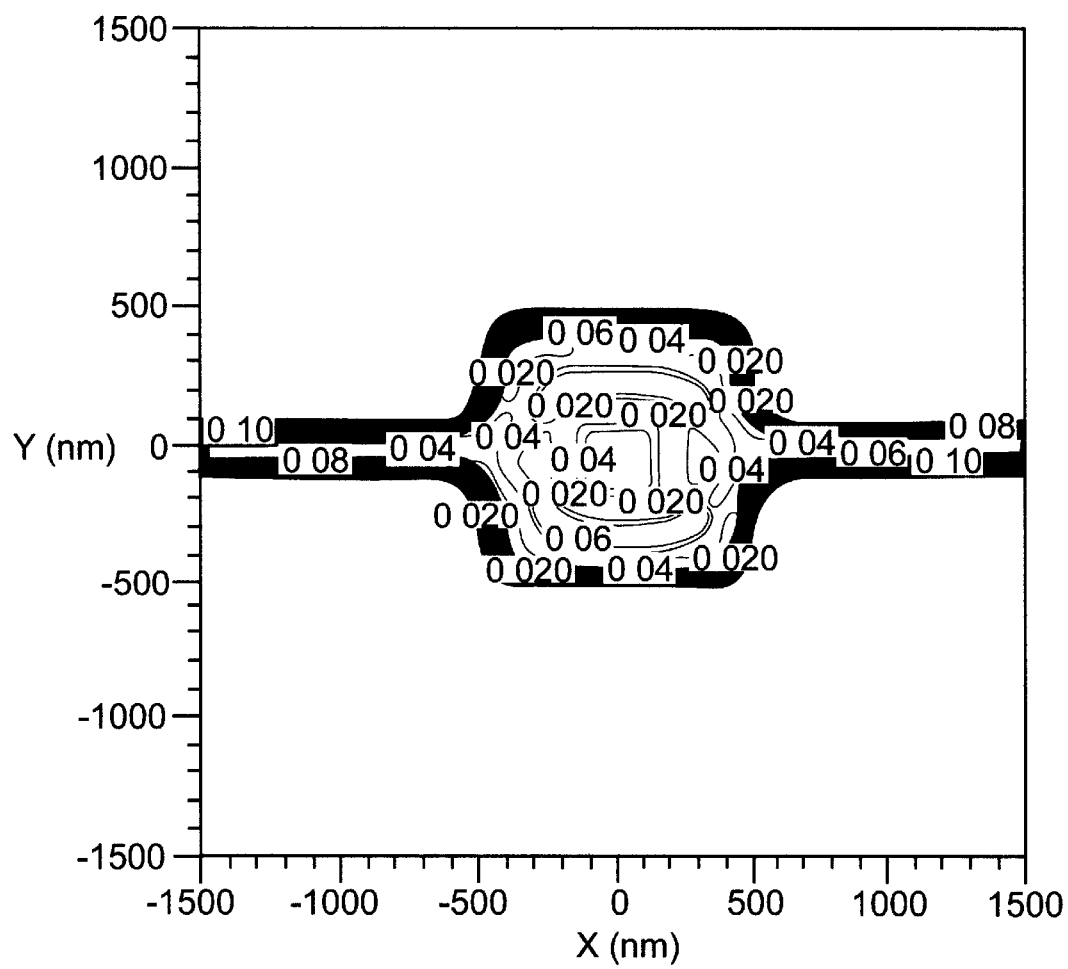
FIG. 12C is a graph showing characteristics of the light intensity of the attenuated phase-shift mask with four transparent opening patterns shown in FIG. 12A.

Comparing to FIGS. 12B and 12C, the maximum light intensity can be repressed at the second rectangular pattern 32 in the FIG. 12C. Therefore, according to the fifth embodiment described above of the invention, the fine light shield characteristics are obtained. Further, although the resist pattern having the poor resist profile at its side edges and its corners is formed because of a side peak phenomenon when a conventional attenuated phase-shift mask to form a resist pattern is used, this problem can be avoided according to the fifth embodiment.

Figure 13:
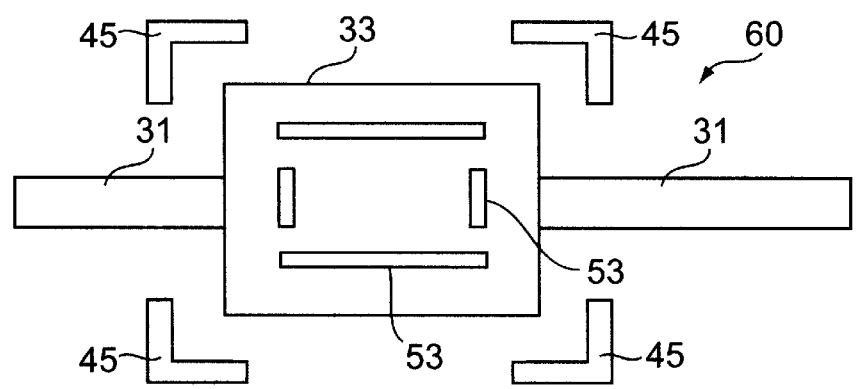
FIG. 13 is a plan view showing details of the third alternative attenuated phase-shift mask as the sixth embodiment.

Furthermore, a third alternative mask pattern 60 as the sixth embodiment shown in FIG. 13 can be formed if the mask pattern which is defined within a circuit pattern has a shape shown in FIG. 7A. Referring to FIG. 13, the second alternative mask pattern 60 has a combination of four transparent opening pattern 53 which are descried in the second alternative mask pattern 50, and four L-letter opaque patterns 45 which are described in the first alternative mask pattern 40.

Figure 14A:
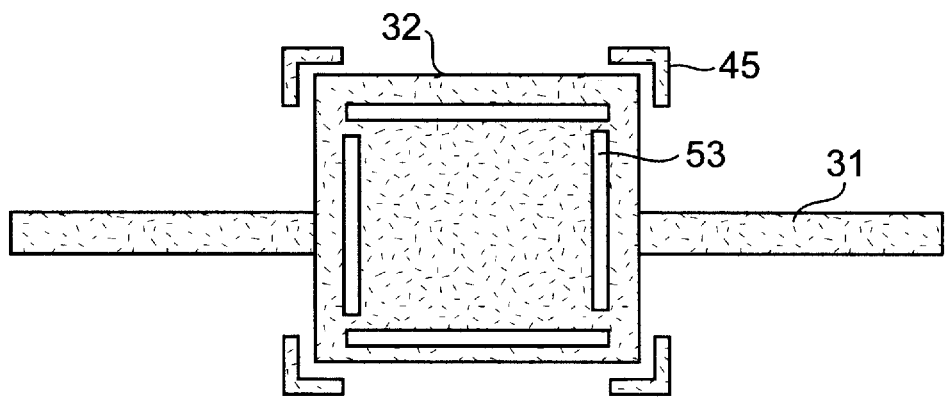
FIG. 14A is an illustration of the attenuated phase-shift mask shown in FIG. 13B which is exposed to light.
Figure 14B:
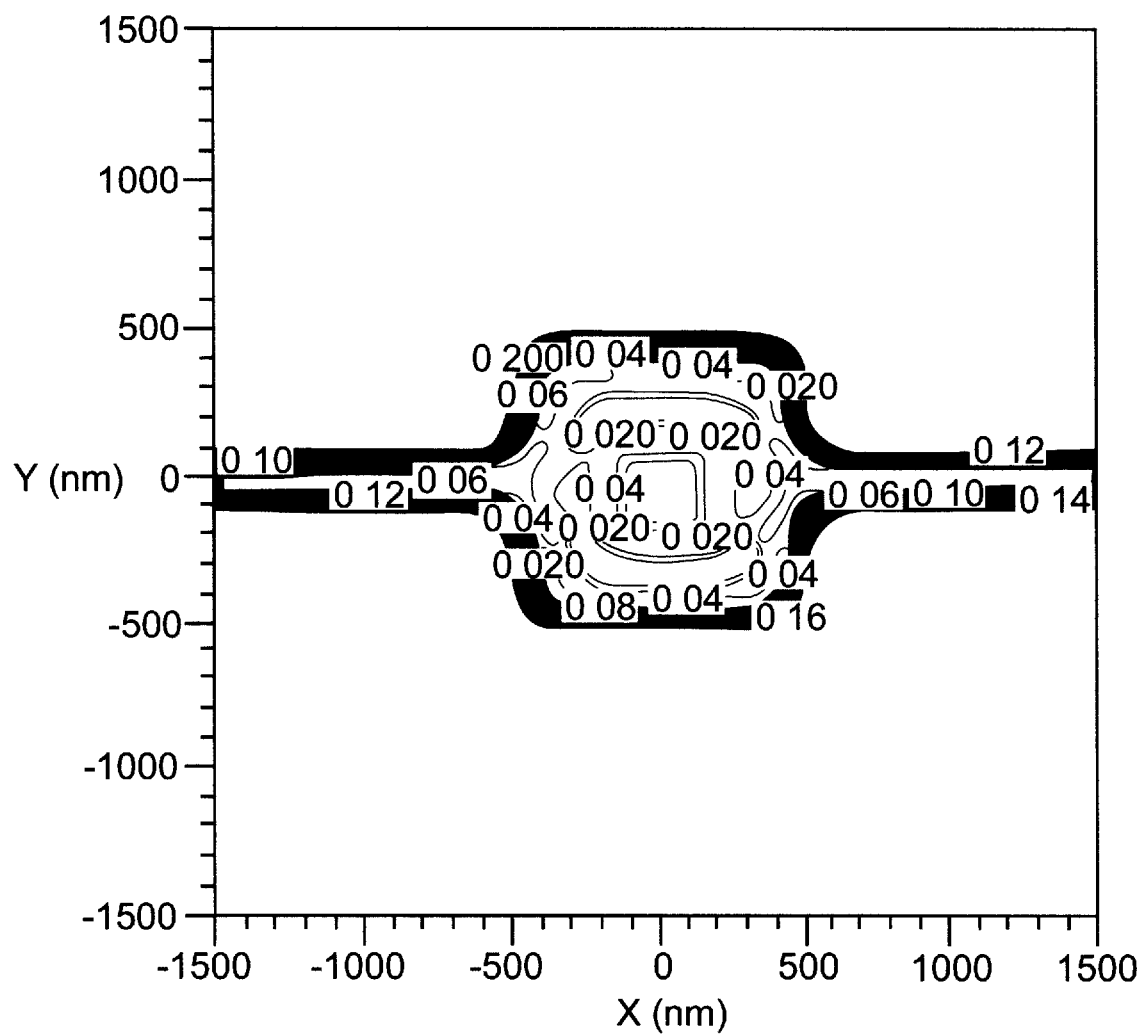
FIG. 14B is a graph showing characteristics of the light intensity of the third alternative attenuated phase-shift mask shown in FIG. 14A.

As shown in FIG. 14B, according to the sixth embodiment described above of the invention, it is possible to avoid a bad resist profile which is liable to formed at the edges of the resist pattern, and also avoid to form thinner resist pattern at the pattern edge which is formed by the side peak effect. Furthermore, comparing to the third embodiment shown in FIG. 7B, a finer and more precise resist pattern can be formed on the semiconductor substrate because of the four L-letter pattern 45. Also, it is possible to repress the multiplication of the light intensity at the corner of the second rectangular pattern 32 because the transparent opening patterns 53 are isolated each other.

While the present invention has been described with reference to illustrative embodiments, this description is not intended to be construed in a limiting sense. Various modifications of the illustrated embodiments, as well as other embodiments of the invention, will be apparent to those skilled in the art on reference to this description. Therefore, the appended claims are intended cover any such modifications or embodiments as falls within the true scope of the invention.

We claim:

1. An attenuated phase-shift mask including a mask substrate and a rectangular pattern having a side (L) formed on the substrate, which is defined within a large pattern that is transferred on a resist material formed on a semiconductor substrate, the rectangular pattern comprising:
   a plurality of first opaque patterns, each having a width (ML) equal to 1 to 1½ times the resolution limit of the resist material; and
   at least one transparent opening pattern, having a width (MS) less than half the resolution limit of the resist material;
   wherein the number (X) of the opaque patterns and transparent opening patterns is determined by the following equations:

$$X=2P+1,$$

where $$P=\text{ROUND UP }((L-ML)/(ML+MS)),$$

where P takes a value of the next highest integer value if (L−ML) divided by (ML+MS) is not an integer.

2. An attenuated phase-shift mask having a rectangular pattern as claimed in claim 1, further comprising at least one second opaque pattern having a width (ML−S) which is shorter than the first opaque pattern's width if the result of (L−ML)/(ML+MS) is not an integer.

3. An attenuated phase-shift mask having a rectangular pattern as claimed in claim 2, wherein the first and second opaque patterns and the transparent opening pattern are formed in rectangular shape and are elongated along the longer side of the rectangular pattern.

4. An attenuated phase-shift mask including a mask substrate and a rectangular pattern having a side (L) formed on the substrate, which is defined within a large pattern that is transferred on a resist material formed on a semiconductor substrate, the rectangular pattern comprising:
   a frame shaped opaque pattern having a width (ML1) equal to 1 to 1½ times the resolution limit of the resist material; and
   a rectangular area spaced from the frame shaped opaque pattern having a width (MS2) less than half the resolution limit of the resist material, the area having a plurality of first opaque patterns, each having a width (ML2) equal to 1 to 1½ times the resolution limit of the resist material and a transparent opening pattern having a width (MS2) less than half the resolution limit of the resist material;
   wherein the number (X) of the opaque patterns and transparent opening patterns is determined by the following equations:

$$X=2P+1,$$

where $$P=\text{ROUND UP }((L-2(ML1+MS1)-ML1)/(ML1+MS2)),$$

where P takes a value of the next highest integer value if (L−2(ML1+MS1)−ML1) divided by (ML1+MS2) is not an integer.

5. An attenuated phase-shift mask having an area as claimed in claim 4, further comprising at least one second opaque pattern having a width (ML2−S) which is shorter than the first opaque pattern's width if the result of (L−2 (ML1−MS1)−ML1)/(ML1+MS2) is not an integer.

6. An attenuated phase-shift mask having a rectangular pattern as claimed in claim 5, wherein the first and second opaque patterns and the transparent opening pattern are formed in rectangular shape and are elongated along the longer side of the area.

7. An attenuated phase-shift mask including a mask substrate and a rectangular pattern formed on the substrate, which is defined within a large pattern that is transferred on a resist material formed on a semiconductor substrate, the rectangular pattern comprising:
a frame shaped opaque pattern having a width equal to 1 to 1½ times the resolution limit of the resist material;
a frame shaped transparent opening pattern having a width less than half the resolution limit of the resist material, the frame shaped transparent opening pattern being surrounded by the frame shaped opaque pattern; and
a rectangular opaque pattern, which is surrounded by the frame shaped transparent opening pattern.

8. An attenuated phase-shift mask having a rectangular pattern as claimed in claim 7, further comprising a L letter shaped opaque pattern having a width less than half the resolution limit of the resist material, which is spaced from one of corners of the rectangular pattern by a distance less than the resolution limit of the resist material.

9. An attenuated phase-shift mask having a rectangular pattern as claimed in claim 7, further comprising four L letter shaped opaque patterns, each having a width less than half the resolution limit of the resist material, which are spaced from each corner of the rectangular pattern by a distance less than the resolution limit of the resist material.

10. An attenuated phase-shift mask including a mask substrate and a rectangular pattern formed on the substrate, which is defined within a large pattern that is transferred on a resist material formed on a semiconductor substrate, the rectangular pattern comprising:
four rectangular transparent opening patterns, each having a width less than the resolution limit of the resist material, which are elongated along sides of the rectangular pattern respectively and are spaced from each side of the rectangular pattern by a distance that is more than the resolution limit of the resist material.

11. An attenuated phase-shift mask having a rectangular pattern as claimed in claim 10, further comprising a L letter shaped opaque pattern having a width less than half the resolution limit of the resist material, which is spaced from one of corners of the rectangular pattern by a distance less than the resolution limit of the resist material.

12. An attenuated phase-shift mask having a rectangular pattern as claimed in claim 10, further comprising four L letter shaped opaque patterns, each having a width less than half the resolution limit of the resist material, which are spaced from each corner of the rectangular pattern by a distance less than the resolution limit of the resist material.

13. A method for manufacturing an attenuated phase-shift mask having a large pattern that is transferred to a resist material formed on semiconductor substrate, comprising:
preparing a mask substrate;
forming a large pattern on the mask substrate;
defining a plurality of rectangular patterns, each having a side length (L) within the large pattern;
determining a number (X) of divisions of a first opaque pattern having a width (ML) and a transparent opening pattern having a width (MS) by the following equations, the width (ML) being equal to 1 to 1½ times the resolution limit of the resist material and the width (MS) being less than half the resolution limit of the resist material;

$$X=2P+1,$$

where $$P=\text{ROUND UP}\ ((L-ML)/(ML+MS)),$$

where P takes a value of the next highest integer value if (L−ML) divided by (ML+MS) is not an integer;
forming the first opaque patterns and the transparent opening patterns on the mask followed by the equations.

14. A method for manufacturing an attenuated phase-shift mask according to claim 13, further comprising forming at lease one second opaque pattern having a width (ML−S) which is shorter than the first opaque pattern's width if the result of (L−ML)/(ML+MS) is not an integer.

15. A method for manufacturing an attenuated phase-shift mask having a large pattern that is transferred to a resist material formed on semiconductor substrate, comprising:
preparing a mask substrate;
forming a large pattern on the mask substrate;
defining a plurality of rectangular patterns, each having a side length (L) within the large pattern, each rectangular pattern having a frame shaped opaque pattern having a width (ML1) equal to 1 to 1½ times the resolution limit of the resist material and an area, which spaced from the frame shaped opaque pattern by a distance (MS1), which is less than half the resolution limit of the resist material;
determining a number (X) of divisions of a first rectangular opaque pattern having a width (ML2) and a rectangular transparent opening pattern having a width (MS2) in the area by the following equations, the width (ML1) being equal to 1 to 1½ times the resolution limit of the resist material and the width (MS2) being less than half resolution limit of the resist material;

$$X=2P+1,$$

where $$P=\text{ROUND UP}\ ((L-2(ML1+MS1)-ML1)/(ML1+MS2)),$$

where P takes a value of the next highest integer value if (L−2(ML1+MS1)−ML1) divided by (ML1+MS2) is not an integer;
forming the frame shaped opaque pattern and the first rectangular opaque patterns and the rectangular transparent opening patterns on the mask substrate followed by the equations.

16. A method for manufacturing an attenuated phase-shift mask according to claim 15, further comprising forming at least one second rectangular opaque pattern having a width (ML−S) which is shorter than the first rectangular opaque pattern's width if the result of (L−2(ML1+MS1)−ML1)/(ML1+MS2) is not an integer.

17. A method for manufacturing an attenuated phase-shift mask having a large pattern that is transferred to a resist material formed on semiconductor substrate, comprising:
preparing a mask substrate;
forming a large pattern on the mask substrate; and
defining a plurality of rectangular patterns within the large pattern, each rectangular pattern having a frame shaped opaque pattern having a width equal to 1 to 1½ times the resolution limit of the resist material, a frame shaped transparent pattern having a width less than half the resolution limit of the resist material, the frame shaped transparent opening pattern being surrounded by the frame shaped opaque pattern, and an rectangular opaque pattern, which is surrounded by the frame shaped transparent opening pattern.

18. A method for manufacturing an attenuated phase-shift mask according to claim 17, further comprising forming a L letter shaped opaque pattern having a width less than half the resolution limit of the resist material, which is spaced from one of corners of the rectangular pattern by a distance less than the resolution limit of the resist material.

19. A method for manufacturing an attenuated phase-shift mask having a large pattern, which is transferred to a resist material formed on semiconductor substrate, comprising:

preparing a mask substrate;

forming a large pattern on the mask substrate; and defining a plurality of rectangular patterns within the large pattern, each rectangular pattern having four rectangular transparent opening patterns, each having a width less than the resolution limit of the resist material, which is elongated along one of sides of the rectangular pattern respectively and is spaced from each side of the rectangular pattern by a distance, which is more than the resolution limit of the resist material.

20. A method for manufacturing an attenuated phase-shift mask according to claim 19, further comprising forming a L letter shaped opaque pattern having a width less than half the resolution limit of the resist material, which is spaced from one of corners of the rectangular pattern by a distance less than the resolution limit of the resist material.

* * * * *